US009936150B2

(12) United States Patent
Hynecek

(10) Patent No.: US 9,936,150 B2
(45) Date of Patent: Apr. 3, 2018

(54) IMAGE SENSORS WITH A ROLLING SHUTTER SCANNING MODE AND HIGH DYNAMIC RANGE

(71) Applicant: SEMICONDUCTOR COMPONENTS INDUSTRIES, LLC, Phoenix, AZ (US)

(72) Inventor: Jaroslav Hynecek, Allen, TX (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 17 days.

(21) Appl. No.: 15/176,342

(22) Filed: Jun. 8, 2016

(65) Prior Publication Data
US 2017/0272667 A1  Sep. 21, 2017

Related U.S. Application Data

(60) Provisional application No. 62/309,835, filed on Mar. 17, 2016.

(51) Int. Cl.
*H04N 5/335* (2011.01)
*H04N 5/355* (2011.01)
(Continued)

(52) U.S. Cl.
CPC ......... *H04N 5/355* (2013.01); *H01L 27/1464* (2013.01); *H01L 27/14616* (2013.01);
(Continued)

(58) Field of Classification Search
CPC ...... H04N 5/349; H04N 5/355; H04N 5/3532; H04N 5/3559; H04N 5/363;
(Continued)

(56) References Cited

U.S. PATENT DOCUMENTS

2008/0239126 A1* 10/2008 Wakamori ........... H04N 5/3532
348/308
2011/0084197 A1* 4/2011 Sugawa ................. H04N 5/335
250/208.1
(Continued)

OTHER PUBLICATIONS

Hong, U.S. Appl. No. 14/877,722, filed Oct. 7, 2015.
(Continued)

*Primary Examiner* — Lin Ye
*Assistant Examiner* — John H Morehead, III
(74) *Attorney, Agent, or Firm* — Treyz Law Group, P.C.; Joseph F. Guihan

(57) ABSTRACT

Imaging pixels may be operated in a rolling shutter scanning mode. Charge signal that is generated on a first chip may be capacitively coupled to signal processing circuits on a second chip. A capacitor may be placed in the signal path that provides signal coupling between the chips and stores overflow charge from pixels that have been exposed to high light level illumination. This enables high dynamic range using only a single charge integration time. The pixel may include an in-pixel negative feedback amplifier. The chip-to-chip electrical connections between the first and second chips may be realized at each pixel as a hybrid bond with a single bond per pixel. Image sensors fabricated using this technology may have small size pixels, high resolution, high dynamic range, and a single charge integration time.

20 Claims, 4 Drawing Sheets

(51) Int. Cl.
*H01L 27/146* (2006.01)
*H04N 5/353* (2011.01)
*H04N 5/349* (2011.01)
*H04N 5/363* (2011.01)

(52) U.S. Cl.
CPC .. *H01L 27/14634* (2013.01); *H01L 27/14636* (2013.01); *H04N 5/349* (2013.01); *H04N 5/3532* (2013.01); *H04N 5/3559* (2013.01); *H04N 5/363* (2013.01)

(58) Field of Classification Search
CPC ......... H01L 27/14636; H01L 27/14616; H01L 27/14634; H01L 27/1464
See application file for complete search history.

(56) References Cited

U.S. PATENT DOCUMENTS

| | | | | |
|---|---|---|---|---|
| 2011/0242381 | A1* | 10/2011 | Sakakibara | H04N 5/355 348/301 |
| 2012/0287294 | A1 | 11/2012 | Kaizu et al. | |
| 2013/0119233 | A1* | 5/2013 | Guezzi | H01L 27/14634 250/208.1 |
| 2014/0063300 | A1 | 3/2014 | Lin et al. | |
| 2014/0077058 | A1* | 3/2014 | Sakano | H01L 27/14612 250/208.1 |
| 2014/0211052 | A1* | 7/2014 | Choi, II | H01L 27/14609 348/297 |
| 2014/0211058 | A1* | 7/2014 | Nishihara | H01L 27/14603 348/308 |
| 2015/0237278 | A1* | 8/2015 | Sakakibara | H04N 5/3698 348/301 |
| 2015/0263053 | A1* | 9/2015 | Yamazaki | H01L 27/14616 257/43 |
| 2015/0350584 | A1* | 12/2015 | Fenigstein | H04N 5/355 250/208.1 |
| 2016/0037093 | A1* | 2/2016 | Mandelli | H04N 5/32 348/296 |
| 2016/0049432 | A1* | 2/2016 | Otaka | H01L 27/14614 348/308 |
| 2016/0088249 | A1* | 3/2016 | Funaki | H04N 5/378 348/296 |
| 2016/0141326 | A1* | 5/2016 | Hanzawa | H01L 27/14603 250/208.1 |
| 2017/0201701 | A1* | 7/2017 | Suzuki | H04N 5/363 |
| 2017/0214841 | A1* | 7/2017 | Blanquart | H04N 5/35554 |

OTHER PUBLICATIONS

Velichko et al., U.S. Appl. No. 14/836,599, filed Aug. 26, 2015.
Hynecek, U.S. Appl. No. 14/862,830, filed Sep. 23, 2015.
Hynecek, U.S. Appl. No. 62/252,767, filed Nov. 9, 2015.

* cited by examiner

IMAGE SENSORS WITH A ROLLING SHUTTER SCANNING MODE AND HIGH DYNAMIC RANGE

CROSS-REFERENCE TO RELATED APPLICATION(S)

This application claims priority to U.S. Provisional Application No. 62/309,835, filed on Mar. 17, 2016, entitled "Image Sensors with a Rolling Shutter Scanning Mode and High Dynamic Range," invented by Jaroslav Hynecek, and is incorporated herein by reference and priority thereto for common subject matter is hereby claimed.

BACKGROUND

This relates generally to imaging systems and, more particularly, to imaging systems with back-side illuminated pixels.

Modern electronic devices such as cellular telephones, cameras, and computers often use digital image sensors. Imager sensors (sometimes referred to as imagers) may be formed from a two-dimensional array of image sensing pixels. Each pixel includes a photosensitive element that receives incident photons (light) and converts the photons into electrical signals. Image sensors are sometimes designed to provide images to electronic devices using a Joint Photographic Experts Group (JPEG) format.

Some conventional image sensors may be able to operate in a high dynamic range (HDR) mode. HDR operation is usually accomplished in image sensors by assigning alternate rows of pixels different integration times. However, assigning two different integration times to different rows in the image sensor array usually sacrifices resolution. Additionally, it may be difficult to achieve a very high dynamic range (e.g., 100 dB or more) using this method.

It would therefore be desirable to be able to provide improved high dynamic range operation in image sensors.

DETAILED DESCRIPTION

Embodiments of the present invention relate to image sensors with back-side illuminated pixels. Specifically, complementary metal-oxide semiconductor (CMOS) image sensor arrays may include pixels that are back-side illuminated. The image sensor arrays may operate in a Rolling Shutter (RS) scanning mode with a High Dynamic Range (HDR). CMOS image sensor arrays may include pixels with pinned photodiodes and a corresponding charge sensing and scanning mechanism. The low light level illumination signal from the pinned photodiodes may be transferred and sensed through a capacitively coupled connection to an inverting in-pixel gain amplifier input node. The image sensor may be implemented using stacked chips. For example, the pinned photodiodes may be formed in a first chip, while the in-pixel gain amplifier input node may be located in a second chip. The high light level illumination signal from the pinned photodiodes may overflow a certain predetermined potential barrier located under a charge transfer gate. The high light level illumination signal may be stored on the same capacitor that provides the connection to the amplifier for the low light level signal. The high light level illumination signal may be sensed by a separate source follower amplifier. The source follower amplifier may also be located on the second chip.

Using the aforementioned pixels may enable image sensors to operate in an HDR mode while using the same integration time length for every pixel in the array. Charge generated in pixels that are exposed to high light level illumination that would normally saturate the pixel is drained away and is integrated on the pixel charge overflow capacitors that can store much more charge than the pinned photodiode of the pixel. It is therefore possible to separately read from the same pixel the low light level illumination signal and the high light level illumination signal. This ensures that a high dynamic range (e.g., 100 dB or more) is maintained without sacrificing resolution or noise performance. High sensitivity to low level light illumination is also maintained.

Figure 1:
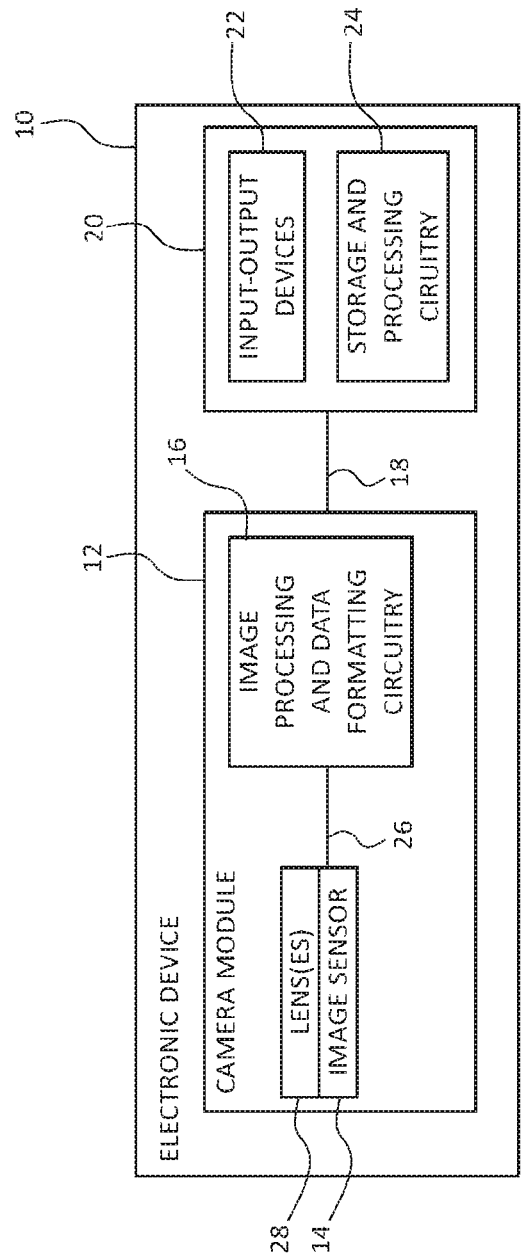
FIG. 1 is a schematic diagram of an illustrative electronic device with an image sensor in accordance with an embodiment of the present invention.

An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 14 and one or more lenses 28. During operation, lenses 28 (sometimes referred to as optics 28) focus light onto image sensor 14. Image sensor 14 includes photosensitive elements (e.g., pixels) that convert the light into analog signals that are later converted to digital data. Image sensors may have any number of pixels (e.g., hundreds, thousands, millions, or more). A typical image sensor may, for example, have millions of pixels (e.g., megapixels). As examples, image sensor 14 may include bias circuitry signal buffering circuits (e.g., source follower and load circuits), sample and hold circuitry, correlated double sampling (CDS) circuitry, amplifier circuitry, analog-to-digital (ADC) converter circuitry, data output circuitry, memory (e.g., data buffering circuitry), address circuitry, etc.

Still and video image data from image sensor 14 may be provided to image processing and data formatting circuitry 16 via path 26. Image processing and data formatting circuitry 16 may be used to perform image processing functions such as automatic focusing functions, depth sensing, data formatting, adjusting white balance and exposure, implementing video image stabilization, face detection, etc.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit chip. The use of a single integrated circuit chip to implement camera sensor 14 and image processing and data formatting circuitry 16 can help to reduce costs. This is, however, merely illustrative. If desired, camera sensor 14 and image processing and data formatting circuitry 16 may be implemented using separate integrated circuit chips.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

Figure 2:
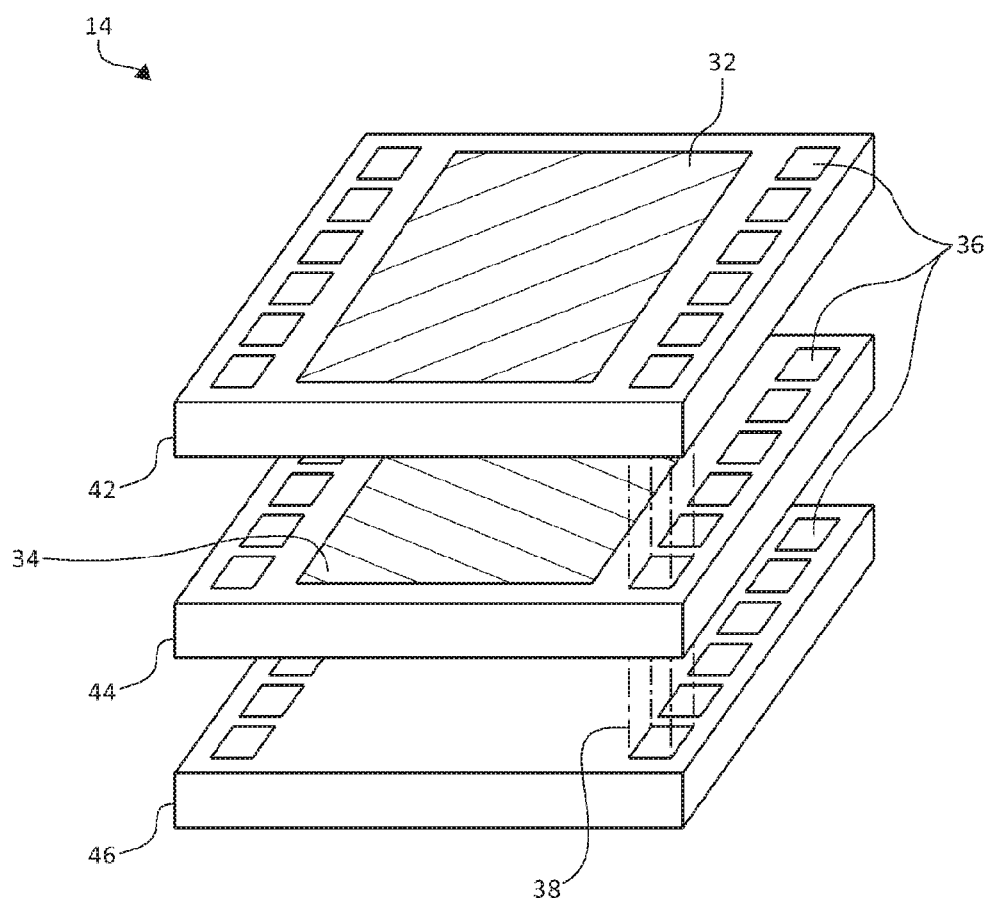
FIG. 2 is a perspective view of an image sensor with multiple substrates bonded together in accordance with an embodiment of the present invention.

FIG. 2 shows an illustrative image sensor such as image sensor 14 in FIG. 1. Image sensor 14 may sense light by converting impinging photons into electrons or holes that are integrated (collected) in sensor pixels. After completion of the integration cycle, collected charge may be converted into a voltage, which may be supplied to the output terminals of image sensor 14. In embodiments where image sensor 14 is a complementary metal-oxide semiconductor (CMOS) image sensor, the charge to voltage conversion may be accomplished directly in the pixels of the image sensor. The analog pixel voltage may then be transferred to the output terminals through various pixel addressing and scanning schemes. The analog signal may also be converted on-chip to a digital equivalent before reaching the chip output. The pixels may have a source follower (SF), which may drive the sense lines that are connected to the pixels using suitable addressing transistors.

After charge to voltage conversion is completed and the resulting signal transferred out from the pixels, the pixels of image sensor 14 may be reset in order to be ready to accumulate new charge. In certain embodiments, pixels may use a floating diffusion region (FD) as a charge detection node. When a floating diffusion node is used, the reset may be accomplished by turning on a reset transistor that conductively connects the FD node to a voltage reference, which may be the pixel SF drain node. This step removes collected charge from the floating diffusion node. However, it may generate kTC-reset noise. This kTC-reset noise may be removed from the signal using a Correlated Double Sampling (CDS) signal processing technique in order to achieve low noise performance.

Image sensor 14 may be formed with one or more substrate layers. The substrate layers may be layers of semiconductor material such as silicon. The substrate layers may be connected using metal interconnects. An example is shown in FIG. 2 in which substrates 42, 44, and 46 are used to form image sensor 14. Substrates 42, 44 and 46 may sometimes be referred to as chips. Upper chip 42 may contain the pinned photodiodes in pixel array 32. Charge transferring transistor gates may also be included in upper chip 42. However, to ensure that there is adequate room for the photodiodes in upper chip 42, much of the pixel circuitry for the pixels may be formed in middle chip 44 and lower chip 46.

Middle chip 44 may be bonded to upper chip 42 with an interconnect layer at every pixel. For example, pixel circuitry 34 in middle chip 44 may be bonded to a Floating Diffusion (FD) that is connected to a charge transfer transistor formed in upper chip 42. Bonding each pixel in upper chip 42 to corresponding pixel circuitry in middle chip 44 (e.g., floating diffusion to floating diffusion) may be referred to as hybrid bonding. Middle chip 44 and lower chip 46 may not be coupled with hybrid bonding. Only peripheral electrical contact pads 36 of each chip may be bonded together (e.g., chip-to-chip connections 38). Each chip in image sensor 14 may include relevant circuitry. The upper chip may contain pinned photodiodes and charge transferring transistor gates. The middle chip may include pixel circuitry (e.g., floating diffusion node, source follower transistor, reset transistor etc.). The bottom chip may include one or more of clock generating circuits, pixel addressing circuits, signal processing circuits such as the CDS circuits, analog to digital converter circuits, digital image processing circuits, and system interface circuits.

Figure 3:
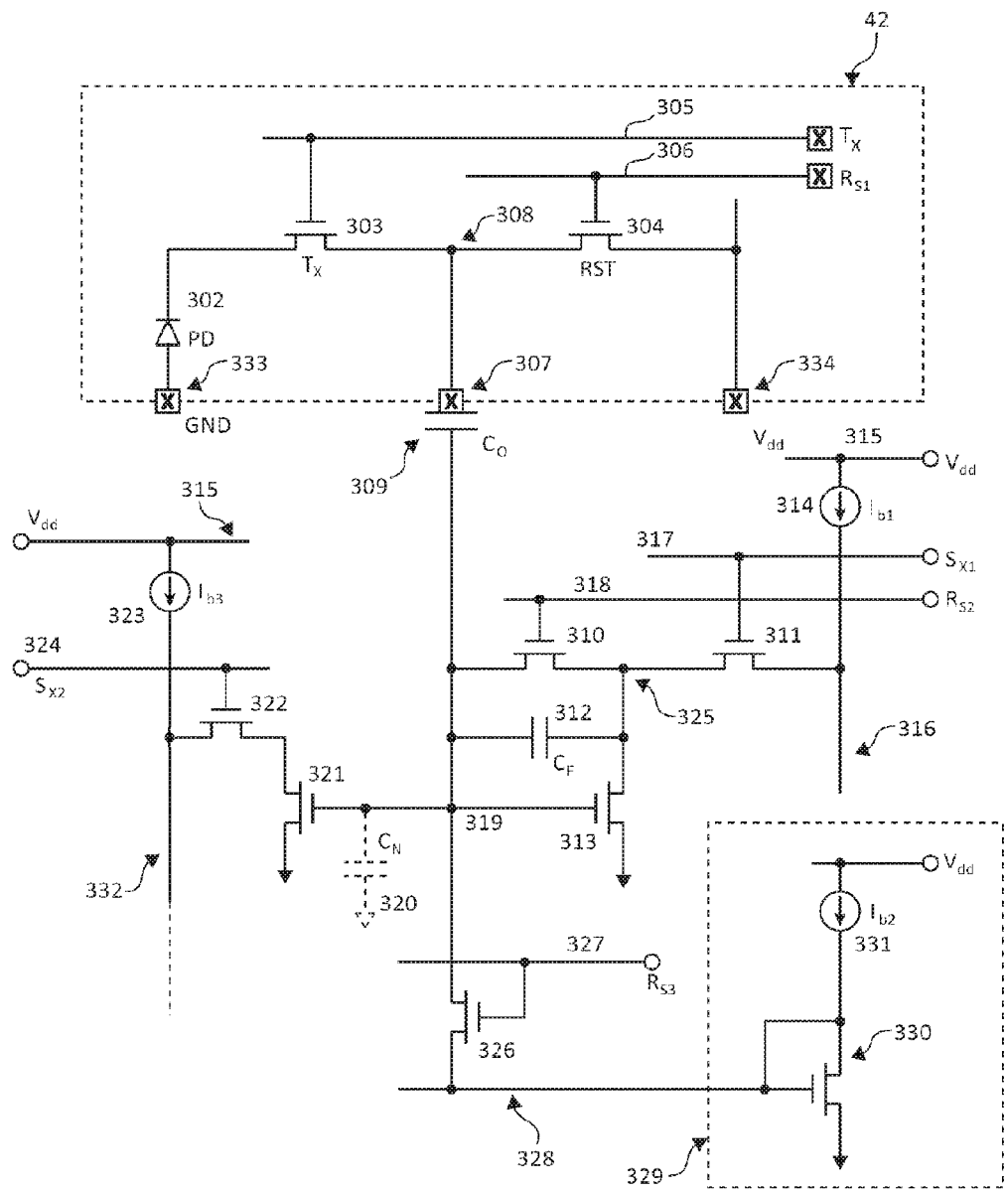
FIG. 3 is a simplified circuit diagram of an illustrative imaging pixel where the signal from the first chip is capacitively coupled to pixel circuits located on the second chip and the floating diffusion region and reset transistor are located in the first chip in accordance with an embodiment of the present invention.

A simplified pixel circuit diagram of an illustrative imaging pixel is shown in FIG. 3. As shown in FIG. 3, upper chip 42 may include pinned photodiode (PD) 302, charge transferring transistor (TX) 303, and reset transistor (RST) 304 that resets floating diffusion (FD) node 308 to the bias voltage Vdd. Bias voltage Vdd may be supplied to the chip through pad 334. Floating diffusion 308 may be a doped semiconductor region (e.g., a region in a silicon substrate that is doped by ion implantation, impurity diffusion, or other doping process). The control signals to this chip are distributed through row lines 305 and 306. Row line 305 may control charge transferring transistor 303 with control signals (TX) while row line 306 may control reset transistor 304 with control signals ($RS_1$). A single bump bond connection for the signal to flow to the underlying middle chip is made through contact pad 307. Ground connection 333 to photodiode 302 may be made at the periphery of the array. The remaining circuits of the imaging pixel may be located on the middle and lower chip.

Contact pad 307 (sometimes referred to as an interconnect layer) may be formed from a conductive material such as metal (e.g., copper). In certain embodiments, the interconnect layer may include solder. The interconnect layer may also be a through silicon via (TSV).

FD node 308 may be coupled to an in-pixel amplifier input signal detection node 319 in the middle chip through capacitor ($C_O$) 309. If desired, capacitor 309 may be directly integrated into the contact pad 307. The inverting amplifier input node 319 (sometimes referred to as a signal detection node) is connected to the gate of amplifier transistor 313. Drain node 325 of amplifier transistor 313 may be connected to column signal line 316 by addressing transistor 311. Amplifier transistor 313 may be an n-channel transistor. The bias to the column signal line 316 may be provided by constant current source ($Ib_1$) 314. A feedback capacitor ($C_f$) 312 that determines the amplifier gain and thus the sensor sensitivity is connected between the nodes 325 and 319. This capacitor is reset by the reset transistor 310, which is connected between the same nodes. The pixel circuit may include node parasitic capacitance ($C_n$) 320. However, the node parasitic capacitance may have a minimal effect on the amplifier gain, which is one of the advantages of the circuit shown in FIG. 3. Similarly, the value of the coupling capacitor 309 has only a minimal influence on the amplifier gain and thus on the charge conversion factor of the sensor. This is another advantage of the pixel circuit shown in FIG. 3, as it enables a suitable selection of the value for capacitor 309 to accommodate a large amount of charge signal and thus extend the dynamic range of the sensor.

The signal detection node 319 may also be reset by transistor 326 to a voltage reference bias provided by voltage reference bias generator 329 through the row line 328. The reset signal ($Rs_3$) may be supplied to transistor 326 through row line 327. The voltage reference generator may be placed at the periphery of the array and may be formed by transistor 330 and a constant current source ($Ib_2$) 331. Transistor 330 may be an n-channel transistor. The Vdd voltage bias may be supplied to the circuit through column or row bias line 315. The reset signal ($Rs_2$) may be supplied to the circuit through row line 318. The row addressing signal ($Sx_1$) may be supplied to the circuit through row addressing line 317.

During operation of the pixel, a high light level illumination signal from node 319 may be sensed by source follower 321. Source follower 321 may be a p-channel transistor and may be addressed by addressing transistor 322. The buffered signal may appear on column signal line 332 that is biased by a constant current source ($Ib_3$) 323. The row addressing signal ($Sx_2$) may be supplied to the circuit through row addressing line 324.

In one illustrative method of operating the imaging pixel shown in FIG. 3, reset transistor 326 may be turned on during a charge integration period while transistors 310, 311, and 322 are turned off. During this time, overflow charge from pixels that are illuminated by a high light level illumination will flow under the charge transfer gate of charge transfer transistor 303 and discharge coupling capacitor 309. Capacitor 309 will have been previously reset during the previous cycle to the Vdd voltage bias level. Charge transferring transistor 303 may be designed such that it incorporates a buried channel path for charge that has already filled up the photodiode to a certain predetermined potential level. In this way, instead of becoming saturated when exposed to high light levels, the excess charge can flow under transistor 303 and discharge capacitor 309.

After the charge integration cycle is completed, the readout cycle may begin. Reset transistor 326 may be turned off and reset transistor 304 may be turned on for a particular row of pixels that is being processed. This generates a certain voltage step, corresponding to the high light level illumination, on charge sensing node 319. This voltage step may be sensed by SF transistor 321 and through the row addressing transistor 322, which may be temporarily also turned on. The voltage step sensed by SF transistor 321 may be delivered to CDS processing circuits located at the periphery of the array.

After this sensing cycle is completed, reset transistor 326 and reset transistor 310 may be turned on. Addressing transistor 311 may also be turned on. Next, reset transistors 326, 310, and 304 may be turned off. Subsequently the output of the amplifier appearing on the column line 316 may be sensed and processed. This output may later be used for a CDS signal reference value. This is followed by applying a pulse to the transfer gate of transistor 303 to deliver the low light level generated signal to FD charge detection node 308 and the resulting voltage change through the capacitor 309 to the input node 319 of the in-pixel negative feedback inverting gain amplifier. The resulting signal output that appears on column signal line 316 may then be processed by the CDS circuit, which subtracts from it the previously stored reference value. It is thus clear that the low noise CDS operation is realized resulting in high performance and low noise for the low light level generated signals. The high light level generated signals may also be processed by a similar CDS scheme which may remove pixel-to-pixel transistor threshold variations.

After the sensing and conversion to digital equivalents of both the high illumination level signal and the low illumination level signal, the circuit may be returned to its original starting configuration and the sensing and processing of the next row may begin. Processing may then occur using suitable gain factors for each channel to reconstruct a single HDR signal output.

Figure 4:
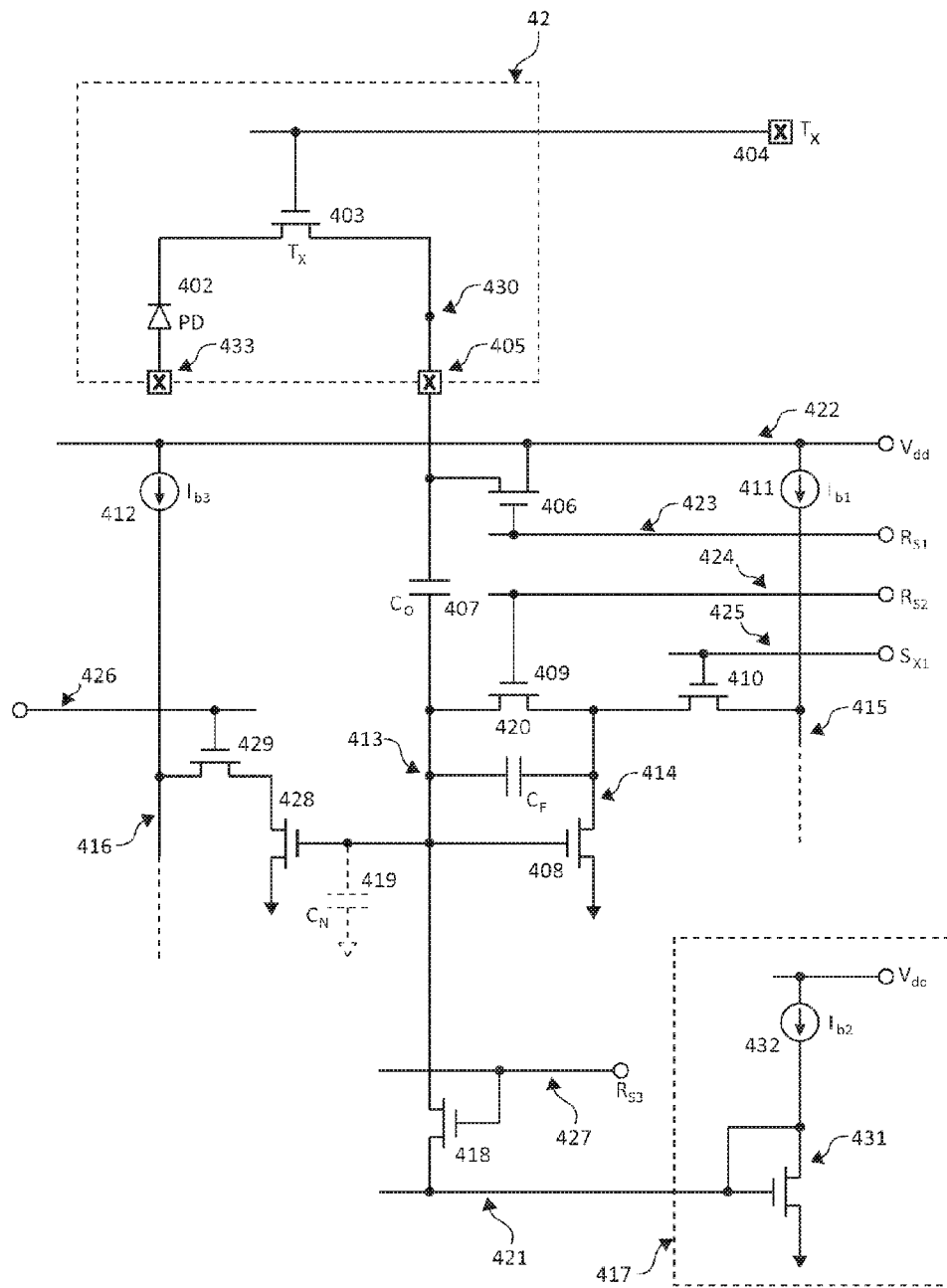
FIG. 4 is a simplified circuit diagram of an illustrative imaging pixel where the signal from the first chip is capacitively coupled to pixel circuits located on the second chip and the reset transistor is located in the second chip in accordance with an embodiment of the present invention.

A simplified pixel circuit diagram of another embodiment of an illustrative imaging pixel is shown in FIG. 4. In FIG. 4, the reset transistor is positioned in the middle chip (as opposed to FIG. 3 where the reset transistor is positioned in the upper chip). FD node 430 may be coupled to the middle level chip in-pixel amplifier input signal detection node 413 through the capacitor ($C_o$) 407. The inverting amplifier input node 413 may be connected to the gate of amplifier transistor 408 that has a parasitic capacitance ($C_n$) 419. Parasitic capacitance 419 may have a negligible influence on the sensor sensitivity and the pixel-to-pixel response uniformity.

Drain node 414 of amplifier transistor 408 may be connected to column signal line 415 by addressing transistor 410. The bias to column signal line 415 may be provided by constant current source ($Ib_1$) 411. The feedback capacitor ($C_f$) 420 may determine the amplifier gain and thus the sensor sensitivity. Capacitor 420 may be connected between nodes 414 and 413. Capacitor 420 may be reset by reset transistor 409 that is connected between the same nodes. The inverting amplifier input node may also be reset by another transistor 418 to a voltage reference bias provided by the bias generator 417 through row line 421. The reset signal ($Rs_3$) may be supplied to transistor 418 through row line 427. The voltage reference generator may be placed at the periphery of the array and may be formed by transistor 431 and constant current source ($Ib_2$) 432. The Vdd voltage bias may be supplied to the circuit through the column bias line 422, the reset signal ($Rs_2$) may be supplied to the circuit through row line 424, and the row addressing signal ($Sx_1$) may be supplied to the circuit through row addressing line 425.

The reset signal ($Rs_1$) to the FD reset transistor 406 may be supplied to the circuit through row reset line 423. Charge transfer from the PD 402 may be activated by applying a pulse to the gate of charge transfer transistor 403 through row addressing line 404. There may be only one bump bond 405 required per pixel. Contact 405 (sometimes referred to as an interconnect layer) may be formed from a conductive material such as metal (e.g., copper). In certain embodiments, the interconnect layer may include solder. The interconnect layer may also be a through silicon via (TSV). The ground contact 433 to the PD 402 may be realized at the periphery of the sensor array.

The high light level illumination signal from node 413 may be sensed by source follower 428, which may be a p-channel transistor. The high light illumination signal may be addressed by addressing transistor 429. The buffered signal may appear on column signal line 416 that is biased by constant current source ($Ib_3$) 412. The row addressing signal may be supplied to this circuit through the row addressing line 426. In general, the operation of the imaging pixel shown in FIG. 4 may be similar to the operation of the imaging pixel shown in FIG. 3 as described above.

One of the advantages of positioning the reset transistor in the middle chip (as shown in FIG. 4) is that upper chip 42 that carries the photodiodes is very simple and will have a very high fill factor efficiency leading to high charge storage capacity. It is also simple to fabricate with a very high yield, which results in low manufacturing costs.

In various embodiments of the present invention, an imaging pixel may include a photodiode formed in a first substrate, a floating diffusion node in the first substrate, a charge transferring transistor in the first substrate that is coupled between the photodiode and the floating diffusion node, a signal sensing node formed in a second substrate, and a capacitor coupled between the floating diffusion node and the signal sensing node. The floating diffusion node and signal sensing node may be coupled by an interconnect layer.

A reset transistor may be coupled between the floating diffusion node and a bias voltage. The reset transistor may be formed in the first or second substrate. The charge transferring transistor may include a buried channel path for overflow charge from the photodiode. The overflow charge may be stored in the capacitor. The imaging pixel may also include a source follower configured to sense an overflow charge generated signal that is based on the overflow charge stored in the capacitor. The capacitor may be configured to transfer a low light level generated signal from the photodiode to the signal sensing node after the source follower senses the overflow charge generated signal. The charge sensing node may serve as an input node of a gain amplifier. The overflow charge generated signal may correspond to high light level illumination. The overflow charge generated signal and the low light level generated signal may be combined to form a single high dynamic range signal. The overflow charge generated signal and the low light level generated signal may both be generated during a single integration time. The capacitor may be formed as an integral part of the interconnect layer.

A method of operating an imaging pixel may include generating charge with the photodiode in response to incident light during an integration time, storing the overflow charge in the capacitor, sampling an overflow charge generated signal that is based on the overflow charge in the capacitor after storing the overflow charge in the capacitor, asserting the charge transferring transistor to transfer a first amount of charge from the photodiode to the signal sensing node after sampling the overflow charge generated signal, and sampling the first amount of charge after asserting the charge transferring transistor. Sampling the overflow charge generated signal may result in a first sample, and sampling the first amount of charge may result in a second sample. The method may also include combining the first sample and the second sample to form a single high dynamic range signal. Sampling the overflow charge generated signal may include using correlated double sampling. Sampling the first amount of charge may include using correlated double sampling. The overflow charge may correspond to charge from high light level illumination that is generated during the integration time, and the first amount of charge may correspond to charge from low light level illumination that is generated during the integration time.

A method of operating an imaging pixel may include collecting charge in the photodiode in response to incident light. The photodiode may accumulate a first amount of charge and generate overflow charge that is associated with high incident light levels. The overflow charge may be stored in the capacitor. The method may also include sampling the overflow charge that is associated with the high incident light levels, resetting the capacitor, transferring the first amount of charge to the charge sensing node with the charge transferring transistor, and sampling the first amount of charge. The method may also include forming a single high dynamic range signal after sampling the overflow charge and sampling the first amount of charge.

The foregoing is merely illustrative of the principles of this invention and various modifications can be made by those skilled in the art without departing from the scope and spirit of the invention.

What is claimed is:

1. An imaging pixel comprising:
   a photodiode formed in a first substrate;
   a floating diffusion node in the first substrate;
   a charge transferring transistor in the first substrate that is coupled between the photodiode and the floating diffusion node;
   a signal sensing node formed in a second substrate, wherein the floating diffusion node and signal sensing node are coupled by an interconnect layer; and
   a capacitor coupled between the floating diffusion node and the signal sensing node, wherein only the interconnect layer and the floating diffusion node are in the electrical path between the capacitor and the charge transferring transistor.

2. The imaging pixel defined in claim 1, further comprising:
   a reset transistor that is coupled between the floating diffusion node and a bias voltage, wherein the reset transistor is formed in the first substrate.

3. The imaging pixel defined in claim 1, further comprising:
   a reset transistor that is coupled between the floating diffusion node and a bias voltage, wherein the reset transistor is formed in the second substrate.

4. The imaging pixel defined in claim 1, wherein the charge transferring transistor includes a buried channel path for overflow charge from the photodiode.

5. The imaging pixel defined in claim 4, wherein the overflow charge is stored in the capacitor.

6. The imaging pixel defined in claim 5, further comprising:
   a source follower configured to sense an overflow charge generated signal that is based on the overflow charge stored in the capacitor.

7. The imaging pixel defined in claim 6, wherein the capacitor is configured to transfer a low light level generated signal from the photodiode to the signal sensing node after the source follower senses the overflow charge generated signal.

8. A method of operating an imaging pixel, wherein the imaging pixel comprises a photodiode formed in a first substrate, a floating diffusion node in the first substrate, a charge transferring transistor in the first substrate that is coupled between the photodiode and the floating diffusion node, a signal sensing node formed in a second substrate, a capacitor coupled between the floating diffusion node and the signal sensing node, a source follower transistor, a first column signal line, an amplifier transistor, and a second column signal line, the method comprising:
   with the photodiode, generating charge in response to incident light during an integration time, wherein the charge transferring transistor includes a buried channel path for overflow charge from the photodiode;
   storing the overflow charge in the capacitor;
   after storing the overflow charge in the capacitor, sampling an overflow charge generated signal that is based on the overflow charge in the capacitor, wherein sampling the overflow charge generated signal comprises sampling the overflow charge generated signal using the source follower transistor and the first column signal line;

after sampling the overflow charge generated signal, asserting the charge transferring transistor to transfer a first amount of charge from the photodiode to the signal sensing node; and after asserting the charge transferring transistor, sampling the first amount of charge using the amplifier transistor and the second column signal line.

9. The method defined in claim 8, wherein sampling the overflow charge generated signal results in a first sample, and wherein sampling the first amount of charge results in a second sample, the method further comprising:

combining the first sample and the second sample to form a single high dynamic range signal.

10. The method defined in claim 8, wherein sampling the overflow charge generated signal comprises using correlated double sampling.

11. The method defined in claim 10, wherein sampling the first amount of charge comprises using correlated double sampling.

12. The method defined in claim 8, wherein the overflow charge corresponds to charge from high light level illumination that is generated during the integration time, and wherein the first amount of charge corresponds to charge from low light level illumination that is generated during the integration time.

13. A method of operating an imaging pixel, wherein the imaging pixel comprises a photodiode, a floating diffusion node, a charge transferring transistor that is coupled between the photodiode and the floating diffusion node, and a capacitor that couples the floating diffusion node to a signal sensing node, the method comprising:

collecting charge in the photodiode in response to incident light, wherein the photodiode accumulates a first amount of charge and generates overflow charge that is associated with high incident light levels, wherein the overflow charge is stored in the capacitor;

sampling the overflow charge that is associated with the high incident light levels;

after sampling the overflow charge that is associated with the high incident light levels, resetting the capacitor;

after resetting the capacitor, transferring the first amount of charge to the charge sensing node with the charge transferring transistor; and sampling the first amount of charge.

14. The method defined in claim 13, further comprising:

after sampling the overflow charge and sampling the first amount of charge, forming a single high dynamic range signal.

15. The method defined in claim 13, wherein the photodiode, floating diffusion node, and charge transferring transistor are formed in a first substrate, and wherein the capacitor and signal sensing node are formed in a second substrate.

16. The method defined in claim 15, wherein the imaging pixel further comprises a conductive interconnect layer that connects the first substrate to the second substrate and a reset transistor in the second substrate that is coupled to an additional node, wherein the additional node is interposed between the capacitor and the signal sensing node, and wherein resetting the capacitor comprises asserting the reset transistor.

17. The method defined in claim 15, wherein the imaging pixel further comprises a conductive interconnect layer that connects the first substrate to the second substrate and a reset transistor that is coupled between a bias voltage and an additional node, wherein the additional node is interposed between the capacitor and the conductive interconnect layer, and wherein resetting the capacitor comprises asserting the reset transistor.

18. The method defined in claim 8, wherein the signal sensing node is interposed between the source follower transistor and the amplifier transistor.

19. The method defined in claim 18, wherein the source follower transistor is a p-channel transistor and the amplifier transistor is an n-channel transistor.

20. The method defined in claim 19, wherein the amplifier transistor is coupled to an additional node, wherein an addressing transistor is coupled between the additional node and the second column signal line, and wherein the imaging pixel further comprises a feedback capacitor coupled between the additional node and the signal sensing node.

\* \* \* \* \*